United States Patent
Alhussien et al.

(10) Patent No.: US 9,082,480 B2
(45) Date of Patent: Jul. 14, 2015

(54) DETECTION AND DECODING IN FLASH MEMORIES WITH ERROR CORRELATIONS FOR A PLURALITY OF BITS WITHIN A SLIDING WINDOW

(71) Applicant: LSI Corporation, San Jose, CA (US)

(72) Inventors: Adbel Hakim S. Alhussien, San Jose, CA (US); Wu Chang, Sunnyvale, CA (US); Erich F. Haratsch, Bethlehem, PA (US); Ming Jin, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 289 days.

(21) Appl. No.: 13/780,203

(22) Filed: Feb. 28, 2013

(65) Prior Publication Data

US 2013/0176780 A1   Jul. 11, 2013

Related U.S. Application Data

(63) Continuation-in-part of application No. 12/920,407, filed on Jan. 4, 2011, now Pat. No. 8,724,381, and a continuation-in-part of application No. 13/063,888, filed on Aug. 31, 2011, now Pat. No. 8,830,748, and a continuation-in-part of application No. 13/063,895, filed on May 31, 2011, and a continuation-in-part of application No. 13/063,899, filed on May 31, 2011, now Pat. No. 8,892,966, and a continuation-in-part of application No. 13/063,874, filed on Mar. 14, 2011, and a continuation-in-part of application No. 13/731,551, filed on Dec. 31, 2012.

(51) Int. Cl.
*G11C 11/34* (2006.01)
*G11C 16/04* (2006.01)
*G11C 11/56* (2006.01)

(52) U.S. Cl.
CPC ............ *G11C 16/04* (2013.01); *G11C 11/5642* (2013.01)

(58) Field of Classification Search
CPC ....... G11C 11/5642; G11C 16/26; G11C 7/02
USPC ........................... 365/185.03, 185.33, 185.11
See application file for complete search history.

(56) References Cited

U.S. PATENT DOCUMENTS

| | | | |
|---|---|---|---|
| 2011/0145487 A1 | 6/2011 | Haratsch et al. | |
| 2011/0167305 A1 | 7/2011 | Haratsch et al. | |
| 2011/0225350 A1* | 9/2011 | Burger et al. | ................. 711/103 |
| 2013/0176778 A1* | 7/2013 | Chen et al. | ............... 365/185.03 |
| 2014/0108891 A1* | 4/2014 | Strasser et al. | ........... 365/185.03 |

OTHER PUBLICATIONS

Chang et al., "An Improved Belief-Propagation Decoder for LDPC-Coded Partial-Response Channels," IEEE Transactions on Magnetics, vol. 46, No. 7, pp. 2639-2648 (Jul. 2010).

*Primary Examiner* — Tuan T Nguyen
(74) *Attorney, Agent, or Firm* — Ryan, Mason & Lewis, LLP

(57) ABSTRACT

Methods and apparatus are provided for detection and decoding in flash memories with error correlations for a plurality of bits within a sliding window. Data from a flash memory device is processed by obtaining one or more read values for a plurality of bits from one or more pages of the flash memory device; converting the one or more read values for the plurality of bits to a non-binary log likelihood ratio based on a probability that a given data pattern was written to the plurality of bits when a particular pattern was read from the plurality of bits; and decoding the plurality of bits using a binary decoder. The non-binary log likelihood ratio captures one or more of intra-page correlations and/or intra-cell correlations. A least significant bit and a most significant bit of a given cell can be independently converted and/or jointly converted to the non-binary log likelihood ratio.

22 Claims, 12 Drawing Sheets

DETECTION AND DECODING IN FLASH MEMORIES WITH ERROR CORRELATIONS FOR A PLURALITY OF BITS WITHIN A SLIDING WINDOW

CROSS-REFERENCE TO RELATED APPLICATIONS

The present application is a continuation-in-part patent application of U.S. patent application Ser. No. 12/920,407, filed Jan. 4, 2011, entitled "Methods and Apparatus for Storing Data in a Multi-Level Cell Flash Memory Device With Cross-Page Sectors, Multi-Page Coding And Per-Page Coding;" U.S. patent application Ser. No. 13/063,888, filed Aug. 31, 2011, entitled "Methods and Apparatus for Soft Data Generation in Flash Memories;" and U.S. patent application Ser. No. 13/063,895, filed May 31, 2011, entitled "Methods and Apparatus for Soft Data Generation for Memory Devices Using Reference Cells;" U.S. patent application Ser. No. 13/063,899, filed May 31, 2011, entitled "Methods and Apparatus for Soft Data Generation for Memory Devices Using Decoder Performance Feedback;" and U.S. patent application Ser. No. 13/063,874, filed Mar. 14, 2011, entitled "Methods and Apparatus for Soft Data Generation for Memory Devices Based on Performance Factor Adjustment;" and U.S. patent application Ser. No. 13/731,551, filed Dec. 31, 2012, entitled "Multi-Tier Detection and Decoding in Flash Memories," each incorporated by reference herein.

FIELD OF THE INVENTION

The present invention relates generally to flash memory devices and more particularly, to improved techniques for mitigating the effect of noise, inter-cell interference and other distortions in such flash memory devices with low overall processing delay.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

The analog values stored in memory cells are often distorted. The distortions are typically due to, for example, back pattern dependency (BPD), noise and intercell interference (ICI). A number of techniques have been proposed or suggested for mitigating the effect of noise, ICI, and other distortions. It is important that such mitigation techniques do not unnecessarily impair the write-read speeds for flash read channels. Thus, many effective signal processing and decoding techniques are avoided that would introduce inherent processing delays. Foregoing such complex signal processing techniques, however, reduces the ability of the flash control system designer to maintain sufficient decoding accuracy as flash device geometries scale down.

The smallest writable data unit in a flash memory device is referred to as a page. A page can comprise several codewords of a read channel error correction code (ECC), which is the smallest readable data unit. Depending on the mapping of page bits into memory cell voltages, there is usually a significant statistical correlation among errors in pages mapped to the same wordline. Thus, it has been recognized that there are benefits to coding across multiple pages. In order to maintain high write and read speeds in flash memory devices, however, pages are typically written and decoded on-the-fly, independently from other pages. A need exists for a decoder design that allows a page to be decoded on-the-fly in a normal mode of operation, while optionally also supporting decoding across multiple pages if a failure occurs, which typically rarely happens.

SUMMARY OF THE INVENTION

Generally, methods and apparatus are provided for detection and decoding in flash memories with error correlations for a plurality of bits within a sliding window. According to one aspect of the invention, data from a flash memory device is processed by obtaining one or more read values for a plurality of bits from one or more pages of the flash memory device; converting the one or more read values for the plurality of bits to a non-binary log likelihood ratio based on a probability that a given data pattern was written to the plurality of bits when a particular pattern was read from the plurality of bits; and decoding the plurality of bits using a binary decoder.

Generally, the non-binary log likelihood ratio captures one or more of intra-page correlations and/or intra-cell correlations. The non-binary log likelihood ratio comprises, for example, a cell-based Galois Field value that captures intra-cell correlations. In one exemplary embodiment, a least significant bit and a most significant bit of a given cell are independently converted to the non-binary log likelihood ratio. In a further variation, a least significant bit and a most significant bit of a given cell are jointly converted to the non-binary log likelihood ratio.

A more complete understanding of the present invention, as well as further features and advantages of the present invention, will be obtained by reference to the following detailed description and drawings.

DETAILED DESCRIPTION

Various aspects of the invention are directed to signal processing techniques for mitigating noise, ICI and other distortions in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages, currents or resistances to represent stored data, as would be apparent to a person of ordinary skill in the art.

Aspects of the present invention provide detection and decoding techniques with error processing that do not unnecessarily impair the read speeds for flash control systems or flash read channels. According to one aspect of the invention, detection and decoding techniques are provided that account for error correlations between neighboring hits within a sliding window. A joint log likelihood ratio for one or more bits in a page is generated in a normal mode based on a probability that a given data pattern was written to one or more bits in the page when a particular pattern was read. A joint log likelihood ratio is generated in a recovery mode based on a probability that a given data pattern was written to a plurality of bits in a cell when a particular pattern was read from the plurality of bits. The joint log likelihood ratios for a sliding window including a plurality of bits in the same page are based on statistics collected using past LDPC decisions.

Figure 1:
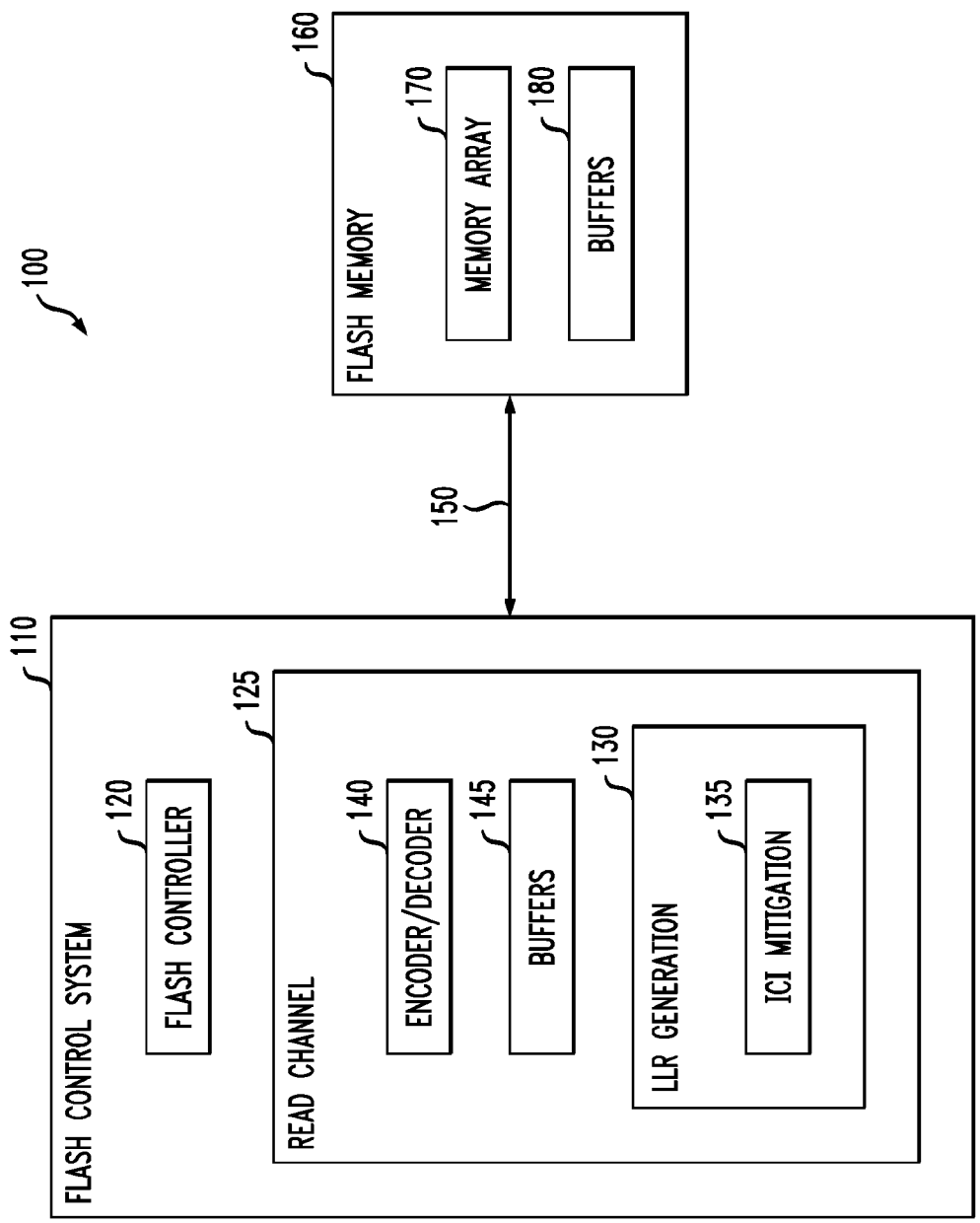
FIG. 1 is a schematic block diagram of an exemplary flash memory system incorporating detection and decoding techniques in accordance with the present invention.

FIG. 1 is a schematic block diagram of an exemplary flash memory system 100 incorporating detection and decoding techniques in accordance with aspects of the present invention. As shown in FIG. 1, the exemplary flash memory system 100 comprises a flash control system 110 and a flash memory block 160, connected by an interface 150. The exemplary flash control system 110 comprises a flash controller 120, and a read channel 125. Moreover, the read channel 125 further comprises an encoder/decoder 140, buffers 145 and an LLR generation block 130. Finally, the LLR generation block 130 further comprises an ICI mitigation block 135.

As discussed further below in conjunction with FIG. 4, the exemplary flash controller 120 and read channel 125 implement one or more detection and decoding processes (discussed further below in conjunction with FIGS. 5-12) that incorporate aspects of the present invention.

The exemplary read channel 125 comprises an encoder/decoder block 140 and one or more buffers 145. It is noted that the term "read channel" can encompass the write channel as well. In an alternative embodiment, the encoder/decoder block 140 and some buffers 145 may be implemented inside the flash controller 120. The encoder/decoder block 140 and buffers 145 may be implemented, for example, using well-known commercially available techniques and/or products, as modified herein to provide the features and functions of the present invention.

Generally, as discussed further below in conjunction with FIGS. 4-12, the exemplary LLR generation block 130 processes one or more read values from the flash memory 160, such as single bit hard values and/or quantized multi-bit soft values, and generates LLR values that are applied to the decoder 140, such as an exemplary low density parity check (LDPC) decoder.

Generally, as discussed further below in conjunction with FIGS. 4-12, the exemplary ICI mitigation block 135 is a specialized function in the LLR generation block 130 that accounts for interference between physically adjacent cells in generating the LLR sequence.

The exemplary flash memory block 160 comprises a memory array 170 and one or more buffers 180 that may each be implemented using well-known commercially available techniques and/or products.

In various embodiments of the disclosed detection and decoding techniques, the exemplary interface 150 may need to convey additional information relative to a conventional flash memory system, such as values representing information associated with aggressor cells. Thus, the interface 150 may need to have a higher capacity or faster rate than an interface in conventional flash memory systems. On the other hand, in other embodiments, this additional information is conveyed to the flash controller 120 in a sequential manner which would incur additional delays. However those additional delays do not notably increase the overall delay due to their rare occurrence. When additional capacity is desired, the interface 150 may optionally be implemented, for example, in accordance with the teachings of International PCT Patent Application Serial No. PCT/US09/4932H, filed Jun. 30, 2009, entitled "Methods and Apparatus for Interfacing Between a Flash Memory Controller and a Flash Memory Array", incorporated by reference herein, which increases the information-carrying capacity of the interface 150 using, for example, Double Data Rate (DDR) techniques.

During a write operation, the interface 150 transfers the program values to be stored in the target cells, typically using page or wordline level access techniques. For a more detailed discussion of exemplary page or wordline level access techniques, see, for example, International Patent Application Serial No. PCT/US09/36110, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 150 transfers hard and/or soft read values that have been obtained from the memory array 170 for target and/or aggressor cells. For example, in addition to read values for the page with the target cell, read values for one or more neighboring pages in neighboring wordlines or neighboring even or odd bit lines are transferred over the interface 150. In the embodiment of FIG. 1, the disclosed detection and decoding techniques are implemented outside the flash memory 160, typically in a process technology optimized for logic circuits to achieve the lowest area. It is at the expense, however, of the additional aggressor cell data that must be transferred on the interface 150.

Figure 2:
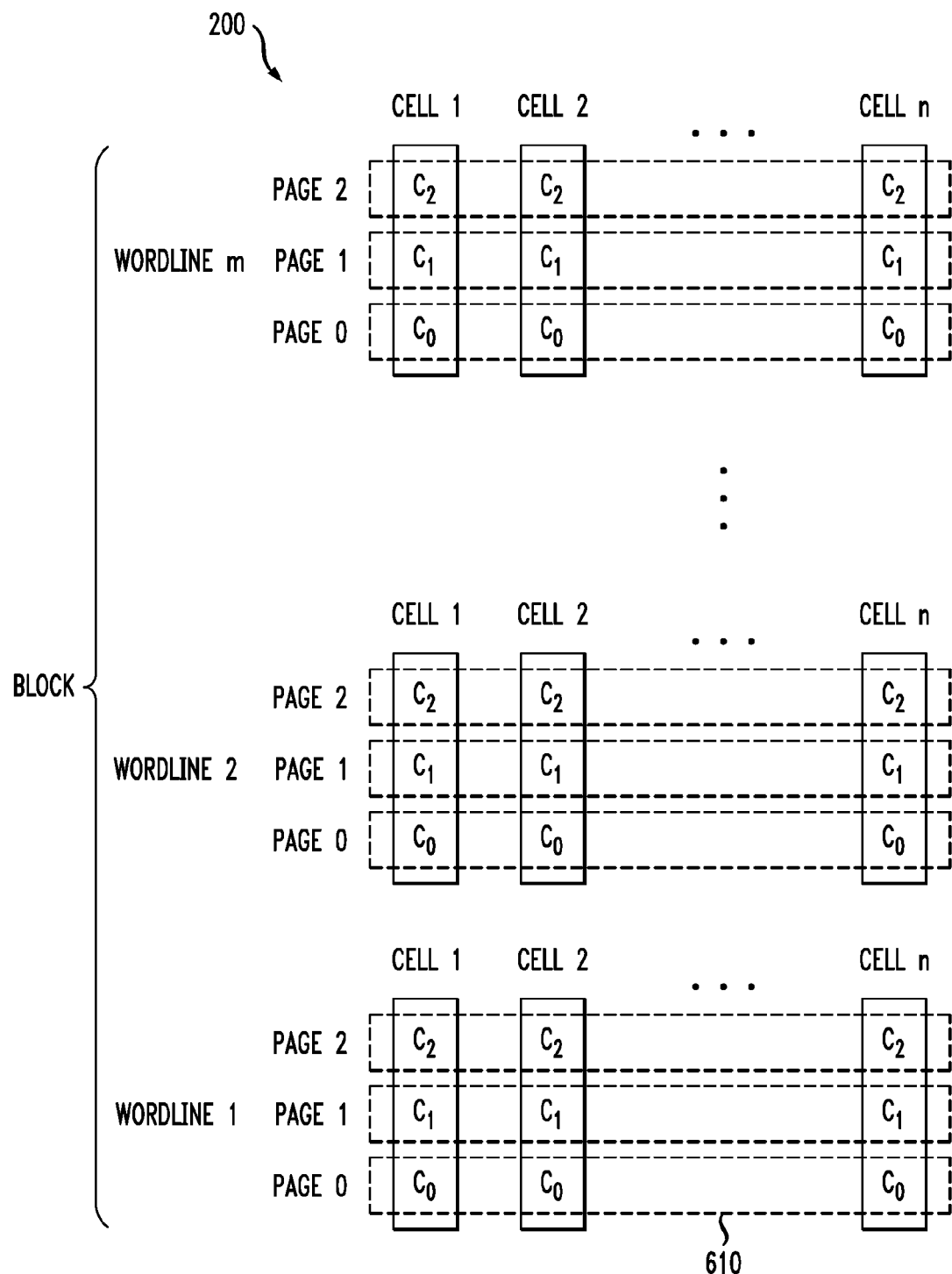
FIG. 2 illustrates an exemplary flash cell array in a multi-level cell (MLC) flash memory device in further detail.

FIG. 2 illustrates an exemplary flash cell array 200 in a multi-level cell (MLC) flash memory device 160 in further detail. As shown in FIG. 2, the exemplary flash cell array 200 stores three bits per flash cell, $c_i$. FIG. 2 illustrates the flash cell array architecture for one block, where each exemplary cell typically corresponds to a floating-gate transistor that stores three bits. The exemplary cell array 200 comprises m wordlines and n bitlines. Typically, in current multi-page cell flash memories, the bits within a single cell belong to different pages. In the example of FIG. 2, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 2) correspond to even pages, and cells with odd numbers such as cells 1 and 3 in FIG. 2) correspond to odd pages. In this case, a page (such as page 0) would contain an even page (even page 0) in even cells and an odd page (odd page 0) in odd cells.

In a two-level cell, for example, each cell stores two bits. In one exemplary implementation, Gray mapping {11, 01, 00, 10} is employed where bits in a cell belong to two different pages. The bits for the two pages in each cell are often referred to as the least significant bit (LSB) and the most significant bit (MSB). For example, for the pattern 01 that is stored in a two-bit-per-cell flash cell, "1" refers to the LSB or lower page, and "0" refers to the MSB or upper page. Experimental studies of flash memory devices indicate that, for example, the error event "01"→"10" has considerable occurrence probability at the end of device life. In addition, based on an additive white Gaussian noise (AWGN) model, the MSB page often exhibits a higher bit error rate (BER) compared to the LSB page. Thus, it has been found that in the presence of such error correlations or error dependencies reading one page improves the decoding success probability of the other.

In summary, MSB page and LSB page errors are known to have statistical correlation at the end of life of a flash memory device relative to the beginning of life. Thus, aspects of the present invention provide joint decoding of LSB and MSB pages of a given wordline in the recovery mode, while also being able to decode LSB and MSB pages independently in the normal mode to keep processing delay low.

Intercell Interference

Figure 3:
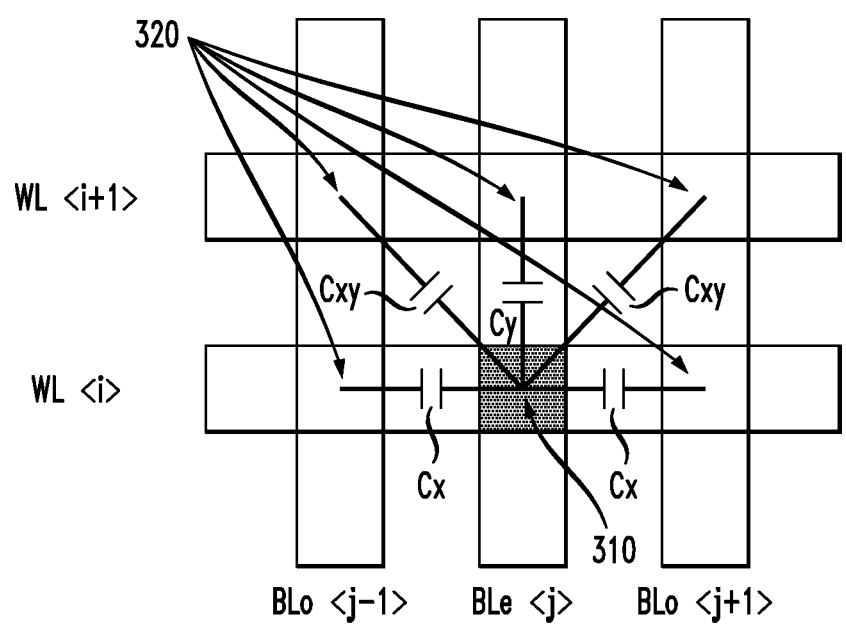
FIG. 3 illustrates the ICI that is present for a target cell due to the parasitic capacitance from a number of exemplary aggressor cells.

ICI is a consequence of parasitic capacitances between cells and is generally considered to be one of the most prominent sources of distortion. FIG. 3 illustrates the ICI that is present for a target cell 310 due to the parasitic capacitance from a number of exemplary aggressor cells 320. The following notations are employed in FIG. 3:

WL: wordline;
BL: bitline;
BLo: odd bitline;
BLe: even bitline; and
C: capacitance.

Aspects of the present invention recognize that ICI is caused by aggressor cells 320 that are programmed after the target cell 310 has been programmed. The ICI changes the voltage, $V_t$, of the target cell 310. In one exemplary embodiment, a "bottom up" programming scheme is assumed and adjacent aggressor cells in wordlines i and i+1 cause ICI for the target cell 310. With such bottom-up programming of a block, ICI from the lower wordline i−1 is removed, and up to five neighboring cells contribute to ICI as aggressor cells 320, as shown in FIG. 3. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells are considered. Other cells that are further away from the target cell can be neglected, if their contribution to ICI is negligible.

In general, the aggressor cells 320 are identified by analyzing the programming sequence scheme (such as bottom up or even/odd techniques) to identify the aggressor cells 320 that are programmed after a given target cell 310.

The ICI caused by the aggressor cells 320 on the target cell 310 can be modeled in the exemplary embodiment as follows:

$$\Delta V_{ICI}^{(i,j)} = \qquad (1)$$
$$k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)}$$

where $\Delta V_t^{(w,b)}$ is the change in $V_t$ voltage of agressor cell (w,b), $$\Delta V_{ICI}^{(i,j)}$$

is the change in $V_t$ voltage of target cell (i,j) due to ICI and $k_x$, $k_y$ and $k_{xy}$ are capacitive coupling coefficients for the x, y and xy direction.

Generally, $V_t$ is the voltage representing the data stored in a cell and obtained during a read operation. $V_t$ can be obtained by a read operation, for example, as a soft voltage value with more precision than the number of bits stored per cell when all pages in a wordline are read, or with two or more bits when only one page in a wordline is read, or as a value quantized to a hard voltage level with the same resolution as the number of bits stored per cell (e.g., 3 bits for 3 bits/cell flash) when all pages in a wordline are read, or a value quantized to one hard bit when only one page in a wordline is read.

For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008), each incorporated by reference herein.

For a more detailed discussion of ICI mitigation, see, for example, International Patent Application Serial No. PCT/US09/49326, filed Jun. 30, 2009, entitled "Methods and Apparatus for Read-Side Intercell Interference Mitigation in Flash Memories," incorporated by reference herein.

Figure 4:
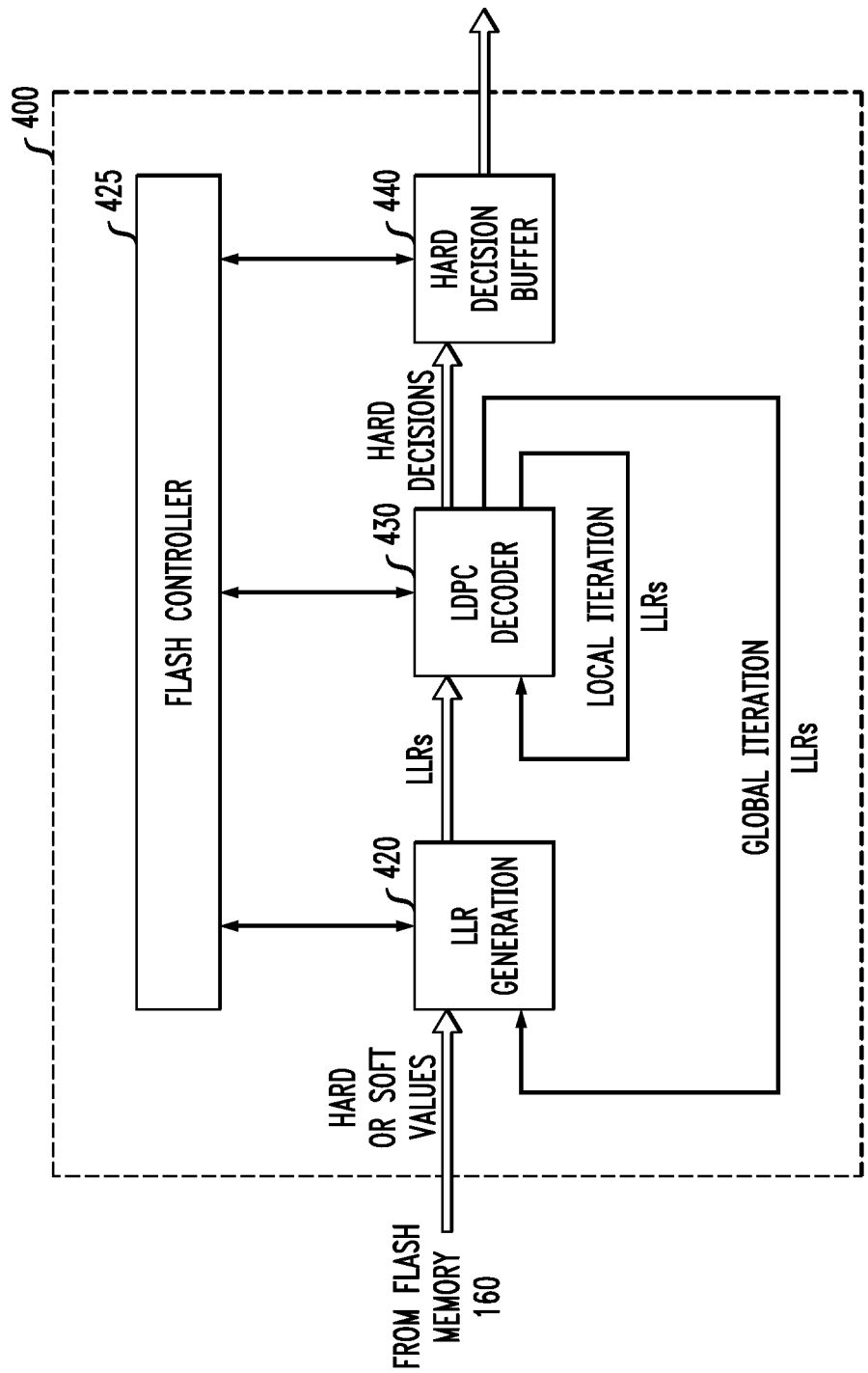
FIG. 4 is a schematic block diagram of an exemplary implementation of a flash memory system incorporating detection and decoding techniques in accordance with aspects of the present invention.

FIG. 4 is a schematic block diagram of an exemplary implementation of a flash memory system 400 incorporating detection and decoding techniques in accordance with aspects of the present invention. As shown in FIG. 4, one or more read values are obtained from the memory array 170 of the flash memory 160. The read values may be, for example, a hard value or a soft value. In a normal mode, for example, a read value is obtained for at least one bit in a given page.

In a given processing mode, such as a normal mode or a recovery mode, an exemplary LLR generation block 420 processes the read values from the flash memory 160, such as single bit hard values and/or quantized multi-bit soft values, and generates LLR values that are applied to an exemplary LDPC decoder 430. The LLR generation performed by the exemplary LLR generation block 420 for each mode of the exemplary detection and decoding is discussed further below in a section entitled "LLR generation."

An exemplary flash controller 425 implements one or more detection and decoding processes (discussed further below in conjunction with FIGS. 5-12) that incorporate aspects of the present invention. In addition, as discussed further below, an exemplary LDPC decoder 430 processes the LLRs generated by the exemplary LLR generation block 420 and provides hard decisions that are stored in hard decision buffers 440.

As discussed further below, the exemplary LDPC decoder 430 can iteratively decode the LLR values, e.g., until the read values are successfully decoded. Iterations inside the LDPC decoder 430 are called local iterations. In these local iterations, LLRs are being updated inside the LDPC decoder using one or more iterations of a message passing algorithm. In addition, as discussed further below, in an exemplary recovery mode, the exemplary LLR generation block 420 and the exemplary LDPC decoder 430 can globally iterate until the read values are successfully decoded. In a global iteration, the LLR generation block 420 provides LLRs to the LDPC decoder 430. After local iterations within the LDPC decoder, the LDPC decoder then provides updated LLRs to the LLR generation block. The LLR generation block uses these LLRs from the LDPC decoder to compute updated LLRs, which are provided to the LDPC decoder. One loop of LLR updates through the LLR generation block and LDPC decoder is called one global iteration. In an iterative detection and decoding system, several local and/or several global iterations are being performed until the data corresponding to a codeword has been successfully detected and decoded. For a more detailed discussion of iterative detection and decoding using local and global iterations, see, for example, U.S. patent application Ser. No. 13/063,888, filed Mar. 14, 2011, entitled "Methods and Apparatus for Soft Data Generation in Flash Memories," incorporated by reference herein.

Figure 5:
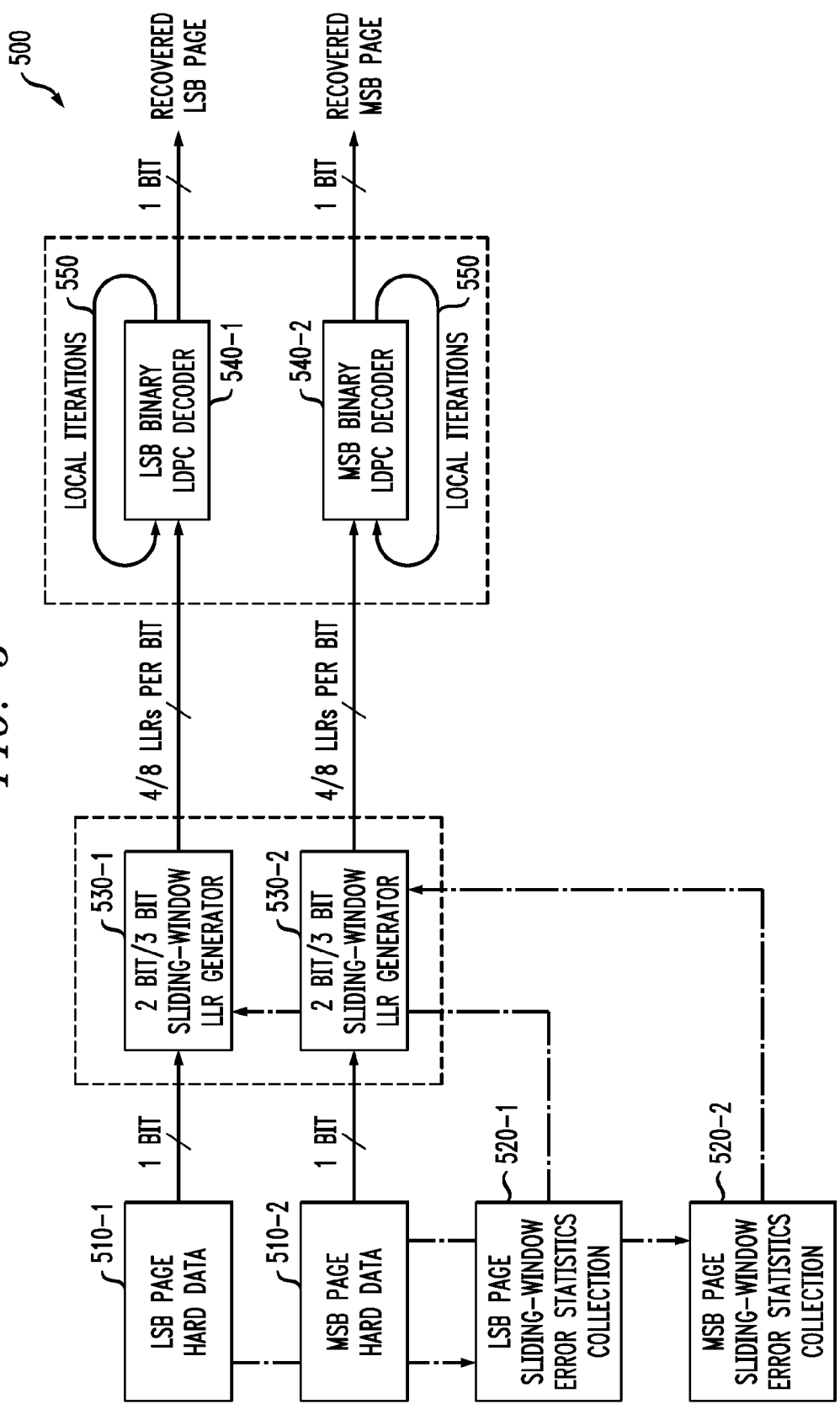
FIG. 5 is a block diagram of an exemplary detection and decoding system incorporating intra-page correlation aspects of the present invention.

FIG. 5 is a block diagram of an exemplary detection and decoding system 500 incorporating intra-page correlation aspects of the present invention. As discussed hereinafter, the exemplary detection and decoding system 500 performs on-the-fly decoding of individual pages in a normal mode for an exemplary two-level cell flash memory 160.

As shown in FIG. 5, the exemplary detection and decoding system 500 processes LSB and MSB page hard data 510-1, 510-2. Each page of the LSB and MSB page hard data 510-1, 510-2 is separately processed by an LSB page sliding window error statistics collection block 520-1 and an MSB page sliding window error statistics collection block 520-2 to collect the error statistics within a sliding window that are used for LLR generation. The error statistics collected within the sliding window are stored in a corresponding table 900, as discussed further below in conjunction with FIG. 9.

In a normal mode, the LSB and MSB page hard data 510-1, 510-2 are processed independently. A first sliding window LLR generator 530-1 processes the LSB hard values 510-1 and a second sliding window LLR generator 530-2 processes the MSB hard values 510-2. The sliding window LLR generators 530-1, 530-2 generate corresponding LLRs. In an exemplary embodiment, the LSB and MSB page hard data 510-1, 510-2 can be processed using a sliding window of 2 or 3 bits and the corresponding LLRs comprise 4 or 8 LLRs per bit.

The LLRs for the LSB and MSB pages are applied to a corresponding LSB binary LDPC decoder 540-1 that generates the recovered LSB page or the corresponding MSB binary LDPC decoder 540-2 that generates the recovered MSB page. The LSB and MSB binary LDPC decoders 540 each optionally perform local iterations 550.

Global iterations between the channel and decoder functions are not needed, as the modified belief propagation decoding algorithm in the LDPC decoders typically captures a sufficient amount of correlation between decoded bits to sustain the least delay in this on-the-fly decoding mode.

Figure 6:
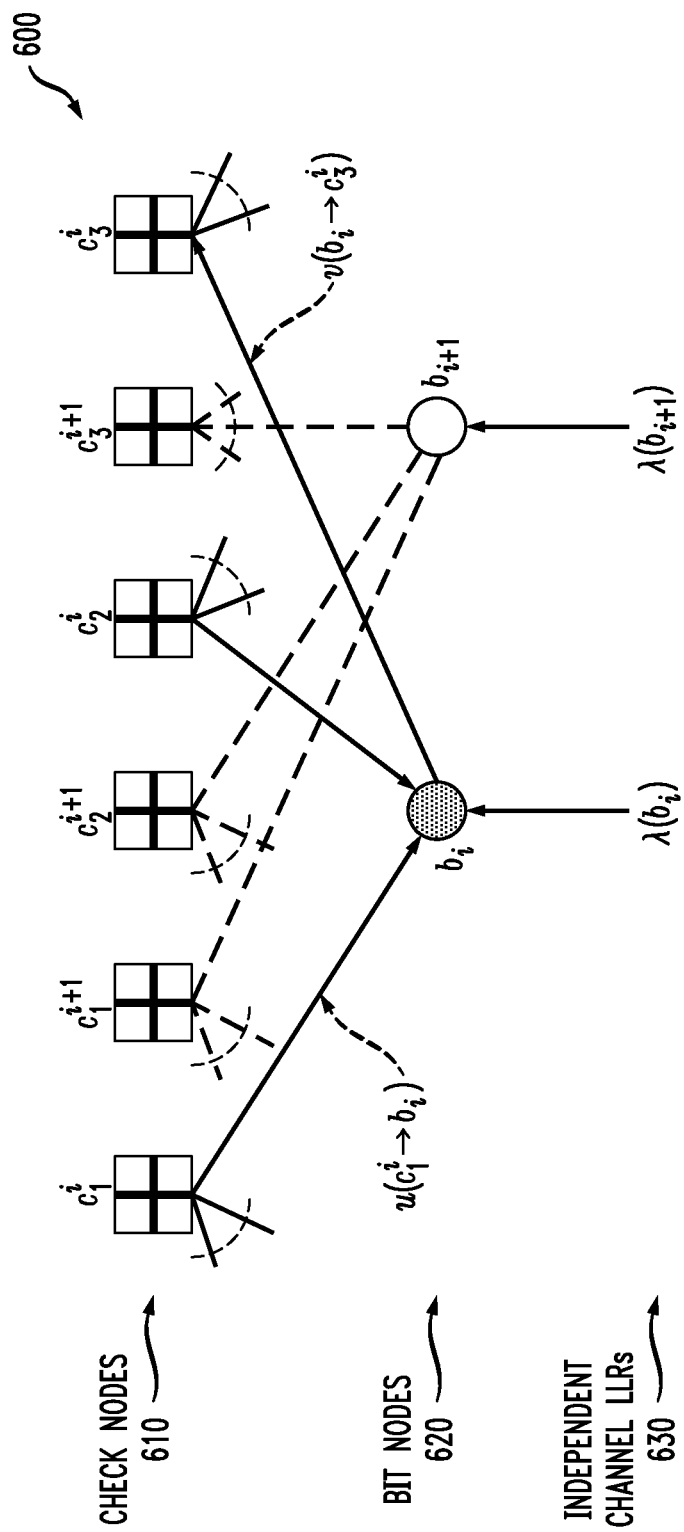
FIG. 6 illustrates an exemplary conventional belief propagation decoding technique.

FIG. 6 illustrates an exemplary conventional belief propagation decoding technique 600. For a detailed discussion of a suitable exemplary conventional belief propagation decoding technique, see, for example, Wu Chang and J. R. Cruz, "An Improved Belief-Propagation Decoder for LDPC-Coded Partial-Response Channels," IEEE Trans. on Magnetics, Vol. 46, No. 7, 2639-648 (July 2010), incorporated by reference herein.

As shown in FIG. 6, messages are exchanged between check nodes 610 and bit nodes 620, in a known manner. Messages u, such as message $u(c_1^i \rightarrow b_i)$, are sent from check nodes 610 to bit nodes 620 and messages v, such as message $v(b_i \rightarrow c_3^i)$, are sent from bit nodes 620 to check nodes 610. It is noted that in the embodiment of FIG. 6, the bit nodes 620 do not exchange messages directly with one another, though information can be relayed indirectly by a check node connected to both bit nodes.

In addition, independent channel LLRs 630 ($\lambda(b)$) are generated and applied to the bit nodes 620, in a known manner.

A quantity U is a sum of all messages u, such as message $u(c_1^i \rightarrow b_i)$, sent from all connected check nodes 610 to a particular bit node 620. U can be computed for bit nodes $b_i$ and $b_{i+1}$ as follows:

$$U(b_i) = \sum_{j=1}^{3} u(c_j^i \rightarrow b_i)$$

$$U(b_{i+1}) = \sum_{j=1}^{3} u(c_j^{i+1} \rightarrow b_{i+1})$$

In addition, an intermediate quantity V comprises the quantity U as well as any messages received by a given bit node $b_i$ from the channel, such as the independent channel LLRs 630 ($\lambda(b_i)$). V can be computed for a given bit node $b_i$ as follows:

$$V(b_i) = U(b_i) + \lambda(b_i)$$

Finally, once V is computed, the messages from a given bit node 620 to a particular check node 610 can be expressed as follows:

$$v(b_i \rightarrow c_j^i) = V(b_i) - u(c_j^i \rightarrow b_i).$$

Generally, the messages from a given bit node 620 to a particular check node 610 comprise the quantity V for the given bit node $b_i$ less the message from the connected particular check node 610 to the given bit node 620 received in the previous LDPC decoder iteration. On the other hand, the way these v messages are processed at the check nodes to generate the new u messages in the next iteration is similar to any conventional belief propagation decoding technique used in the prior art.

Figure 7:
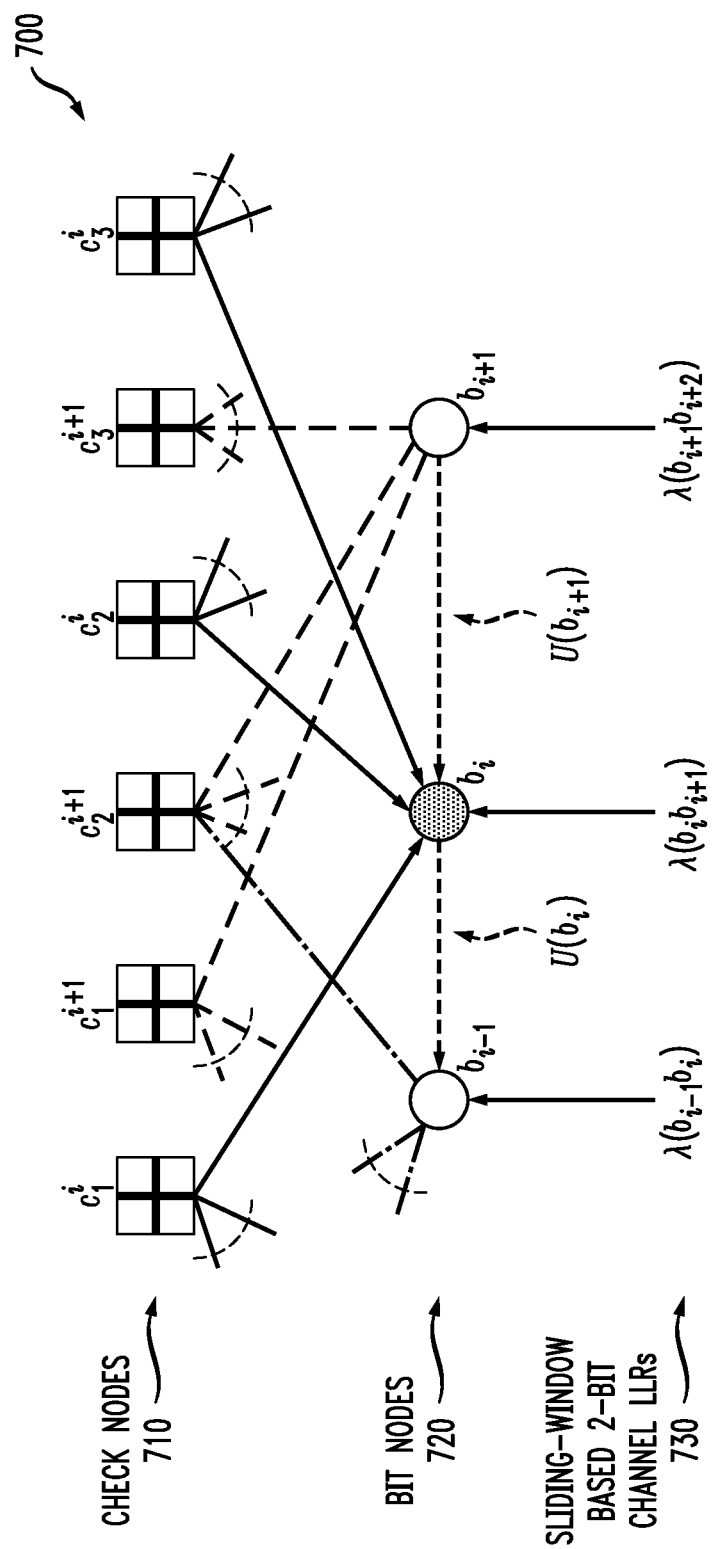
FIG. 7 illustrates an exemplary belief propagation decoding technique incorporating aspects of the invention for an exemplary two-bit sliding window.

FIG. 7 illustrates an exemplary belief propagation decoding technique 700 incorporating aspects of the invention for an exemplary two-bit sliding window. For a more general description, see for example, Wu Chang and J. R. Cruz, "An Improved Belief-Propagation Decoder for LDPC-Coded Partial-Response Channels," IEEE Trans. on Magnetics, Vol. 46, No. 7, 2639-648 (July 2010), incorporated by reference herein.

As shown in FIG. 7, messages are exchanged between check nodes 710 and bit nodes 720, in a similar manner to FIG. 6. Messages u, such as message $u(c_1^i \rightarrow b_i)$, are sent from check nodes 710 to bit nodes 720 and messages v, such as message $v(b_i \to c_3^i)$, are sent from bit nodes 720 to check nodes 710. In addition, as discussed hereinafter, in the embodiment of FIG. 7, the bit nodes 720 exchange messages U with one another, where messages U in FIG. 7 are calculated using the same formulas as those of FIG. 6. In addition, as discussed hereinafter, sliding window-based 2-bit LLRs 730 ($\lambda(b_i b_{i+1})$) are generated and applied to the bit nodes 720.

Finally, the main difference between the exemplary embodiment of FIG. 7 and the conventional embodiment of FIG. 6 is the calculation of intermediate quantity V, which is a function of the messages U exchanged among the bit nodes 720 and any messages received by a given set of bits $b_i b_{i+1}$ from the channel, such as the sliding window-based 2-bit LLRs 730 ($\lambda(b_i b_{i+1})$) for each possible value combination of bits b V can be computed for a given bit $b_i$ as follows:

$$V(b_i) = \max{}^* [\lambda(b_i b_{i+1} = 00) + U(b_{i+1}), \lambda(b_i b_{i+1} = 01)] - \max{}^* [\lambda(b_i b_{i+1} = 10) + U(b_{i+1}), \lambda(b_i b_{i+1} = 11)] + U(b_i).$$

where $\max{}^*(\psi, \zeta) = \max(\psi, \zeta) + \log(1 + e^{-|\psi - \zeta|})$. Then, once V is computed, the messages from a given bit node 720 to a particular check node 710 can be expressed in the same way as FIG. 6.

Figure 8:
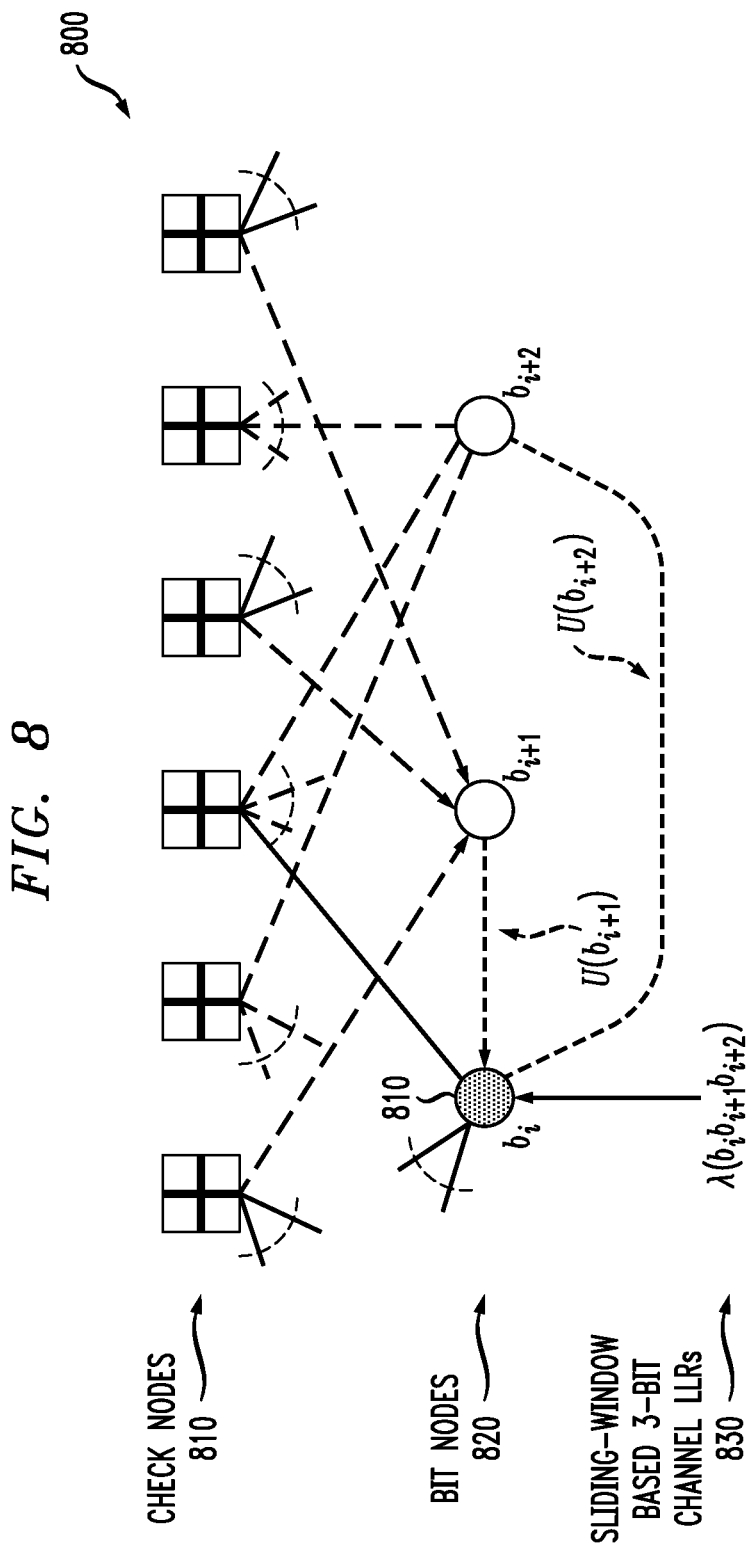
FIG. 8 illustrates an exemplary belief propagation decoding technique incorporating aspects of the invention for an exemplary three-bit sliding window.

FIG. 8 illustrates an exemplary belief propagation decoding technique 800 incorporating aspects of the invention for an exemplary three-bit sliding window. As shown in FIG. 8, messages are exchanged between check nodes 810 and bit nodes 820, in a similar manner to FIG. 7. Messages u, such as message $u(c_1^i \to b_i)$, are sent from check nodes 810 to bit nodes 820 and messages v, such as message $v(b_i \to c_3^i)$, are sent from bit nodes 820 to check nodes 810. In addition, as discussed hereinafter, in the embodiment of FIG. 8, the bit nodes 820 exchange messages U with one another, and messages U in FIG. 8 are calculated using the same formulas as those of FIG. 6. In addition, as discussed hereinafter, sliding window-based 3-bit LLRs 830 ($\lambda(b_i b_{i+1} b_{i+2})$) are generated and applied to the bit nodes 820.

In addition, a quantity V is a function of the messages U exchanged among the bit nodes 820 and any messages received by a given set of bits $b_i b_{i+1} b_{i+2}$ from the channel, such as the sliding window-based 3-bit LLRs 830 ($\lambda(b_i b_{i+1} b_{i+2})$) for each possible combination of bits $b_i b_{i+1} b_{i+2}$. V can be computed for a given bit $b_i$ as follows:

$$V(b_i) = \max{}^* \begin{bmatrix} \lambda(b_i b_{i+1} b_{i+2} = 000) + U(b_{i+1}) + U(b_{i+2}), \\ \lambda(b_i b_{i+1} b_{i+2} = 001) + U(b_{i+1}), \\ \lambda(b_i b_{i+1} b_{i+2} = 010) + U(b_{i+2}), \\ \lambda(b_i b_{i+1} b_{i+2} = 011) \end{bmatrix} - \max{}^* \begin{bmatrix} \lambda(b_i b_{i+1} b_{i+2} = 100) + U(b_{i+1}) + U(b_{i+2}), \\ \lambda(b_i b_{i+1} b_{i+2} = 101) + U(b_{i+1}), \\ \lambda(b_i b_{i+1} b_{i+2} = 110) + U(b_{i+2}), \\ \lambda(b_i b_{i+1} b_{i+2} = 111) \end{bmatrix} + U(b_i).$$

Figure 9:
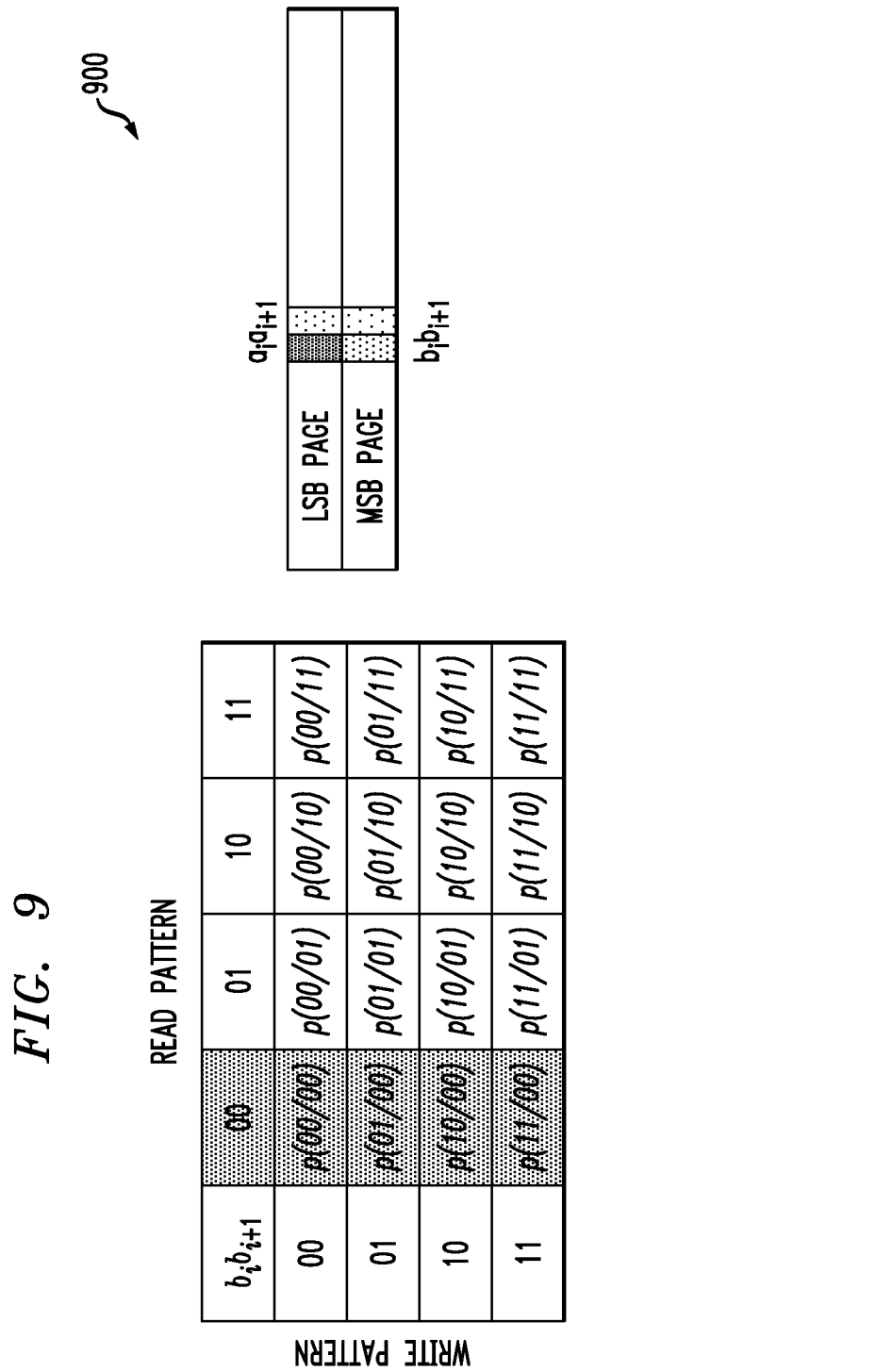
FIG. 9 illustrates an exemplary bit transition probability table that records collected correlation statistics within a two-bit sliding window.

FIG. 9 illustrates an exemplary bit transition probability table 900 that records collected correlation statistics within a two-bit sliding window indicating a transition probability for a given pair of bits ($b_i b_{i+1}$) on the same page. Generally, for a two-bit sliding window, two bits ($b_i b_{i+1}$) are first considered, followed by two bits ($b_{i+1} b_{i+2}$) and so on for each considered bit.

The size of the transition probability table 900 grows exponentially in the number of considered neighboring bits, and the error statistics in the exemplary bit transition probability table 900 are used to compute 2-bit joint LLRs within the sliding window, where the LLRs are defined on a Galois Field of dimension 4 (GF(4)).

In the exemplary embodiment, the 2-bit LLRs are calculated based on error statistics of the adjacent bits in the same wordline. The error statistics can be collected using reference cells or past LDPC decisions of the pages in the wordline. For a discussion of suitable reference cell techniques, see, for example, U.S. patent application Ser. No. 13/063,899, filed Mar. 14, 2011, entitled "Methods and Apparatus for Soft Data Generation for Memory Devices Using Decoder Performance Feedback;" and/or U.S. patent application Ser. No. 13/063,895, filed Mar. 14, 2011, entitled "Methods and Apparatus for Soft Data Generation for Memory Devices Using Reference Cells," each incorporated by reference herein. The transition probability table 900 records a probability that each possible pattern was written to bits ($b_i b_{i+1}$) given that each possible pattern was read (i.e., the reliability of making a decision that a given pattern was written given that a given pattern was read in the normal mode 500). For example, the term "p(10/00)" indicates the probability that the pattern '10' was written to bits ($b_i b_{i+1}$) given that pattern '00' was read for bits ($b_i b_{i+1}$) (or the reliability of making a decision '10' given '00' was read in the normal mode).

The correlation sliding window center can be a function of the bit correlation profile, where for a symmetric correlation profile the center should match the spatial center of the sliding window. In some instances if the length of the sliding window is even, then the center is chosen to best match the correlation profile and several options can be equivalent. The correlation profile can be determined based on characterization of the flash provided by a particular flash vendor. In one example, in the formula above pertaining to FIG. 8, among all three bits the center is the bit with index i among indices i, i+1, and i+2. This means that a bit is mostly correlated with the next two bits and not the old bits. But in flash applications, due to intra page ICI, a bit will typically be correlated equally with the right and left bits so the sliding window center would be chosen as i+1.

The statistics in the transition probability table 900 can be employed to compute 2-bit LLRs 730 as follows. Given that a particular pattern was read, such as a pattern of '00', the corresponding LLRs can be computed using distribution marginalization as follows:

$$\lambda(b_i b_{i+1} = 00 | 00) = \log[p(00 | 00)] - C, \lambda(b_i b_{i+1} = 01 | 00) = \log[p(01/00)] \cdot C$$

$$\lambda(b_i b_{i+1} = 10 | 00) = \log[p(10/00)] - C, \lambda(b_i b_{i+1} = 11 | 00) = \log[p(11/00)] - C$$

where C is a normalization constant.

In a further variation, the bit transition probability table 900 can be a function of one or more performance factors, such as endurance, number of program/erase cycles, number of read cycles, retention time, temperature, temperature changes, process corner, ICI impact, location within the memory array 170, location of wordline and/or page from which the read values are obtained, location of page within wordline from which the read values are obtained and a pattern of aggressor cells. One or more of the performance factors can be varied for one or more different bits within a cell, different pages within a wordline, different bit lines or different hard read data values. For a more detailed discussion of suitable techniques for computing a log likelihood ratio for memory devices based on such performance factor adjustments, see, for example, International Patent Application Serial No. PCT/US09/59069, filed Sep. 30, 2009, entitled "Methods and Apparatus for Soft Data Generation for Memory Devices Based on Performance Factor Adjustment," incorporated by reference herein.

Figure 10:
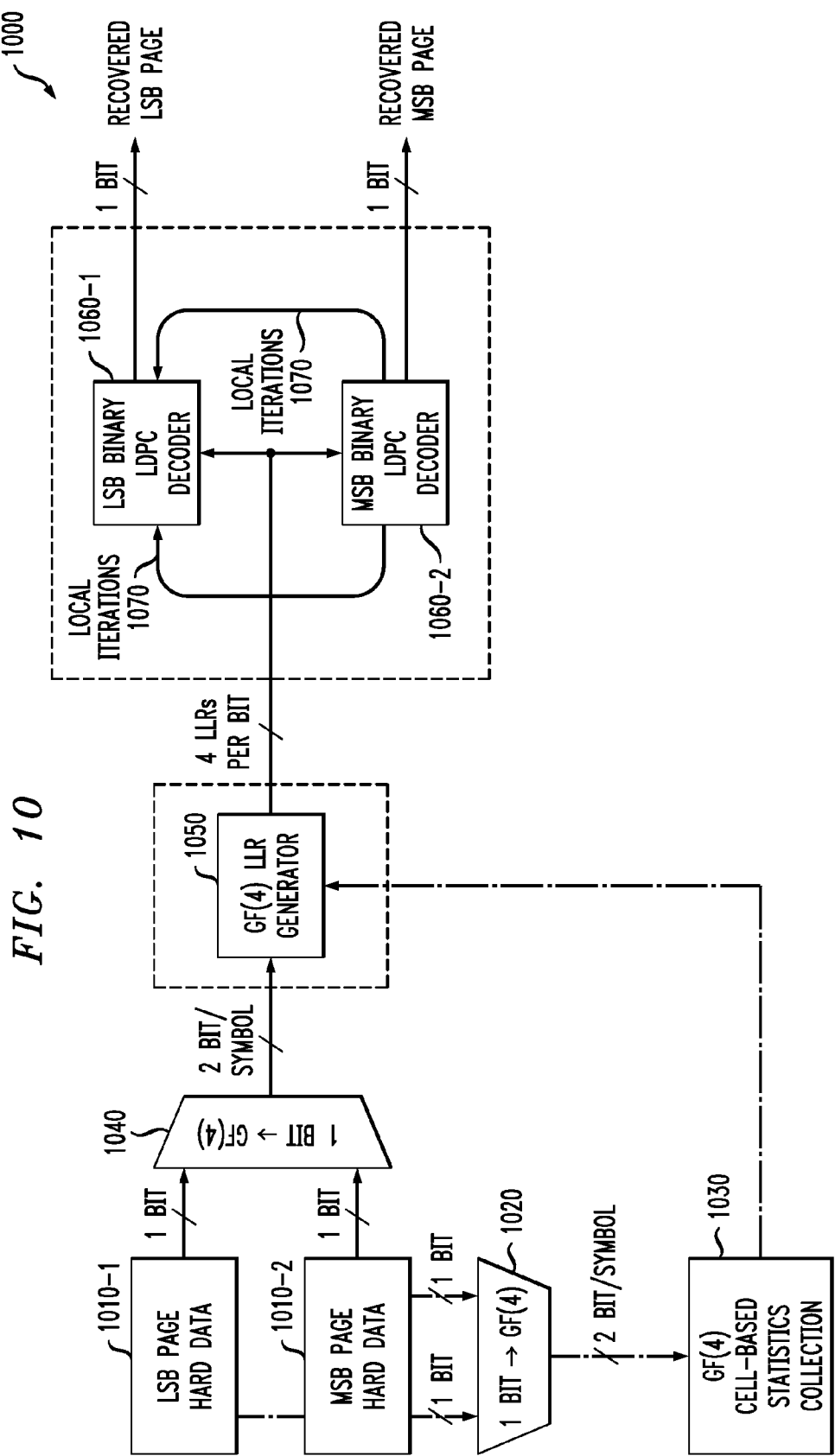
FIG. 10 is a block diagram of an exemplary detection and decoding system incorporating intra-cell correlation aspects of the present invention.

FIG. 10 is a block diagram of an exemplary detection and decoding system 1000 incorporating intra-cell correlation aspects of the present invention. As discussed hereinafter, the exemplary detection and decoding system 1000 performs decoding in a recovery mode for an exemplary two-level cell flash memory 160 using joint LLRs. The exemplary detection and decoding system 1000 processes LSB and MSB page hard data 1010-1, 1010-2 in a recovery mode. The bits of the LSB and MSB page hard data 1010-1, 1010-2 are applied to bit-to-symbol (B/S) converters 1020, 1040 that map the two LSB and MSB bits to symbols. For example, under a Gray encoding scheme, the following exemplary mapping of 2-bits to a symbol can be employed:

00→0; 01→1; 10→2; and 11→3.

The symbols are processed along a first path by a GF(4) cell-based error statistics collection block 1030 that collects the cell-based error statistics that are used for LLR generation, as discussed further below. The collected error statistics are stored in a corresponding table 1200, as discussed further below in conjunction with FIG. 12.

Likewise, the joint LSB/MSB symbols are processed along a second path by a GF(4) LLR generator 1050. The GF(4) LLR generator 1050 generates corresponding symbol (joint) LLRs. In an exemplary embodiment, the corresponding GF(4) LLRs comprise 4 LLRs per bit.

The GF(4) LLRs are applied to a corresponding LSB LDPC decoder 1060-1 that generates the recovered LSB page or the corresponding MSB LDPC decoder 1060-2 that generates the recovered MSB page. The LSB and MSB LDPC decoders 1060 optionally perform local iterations 1070 between them.

Figure 11:
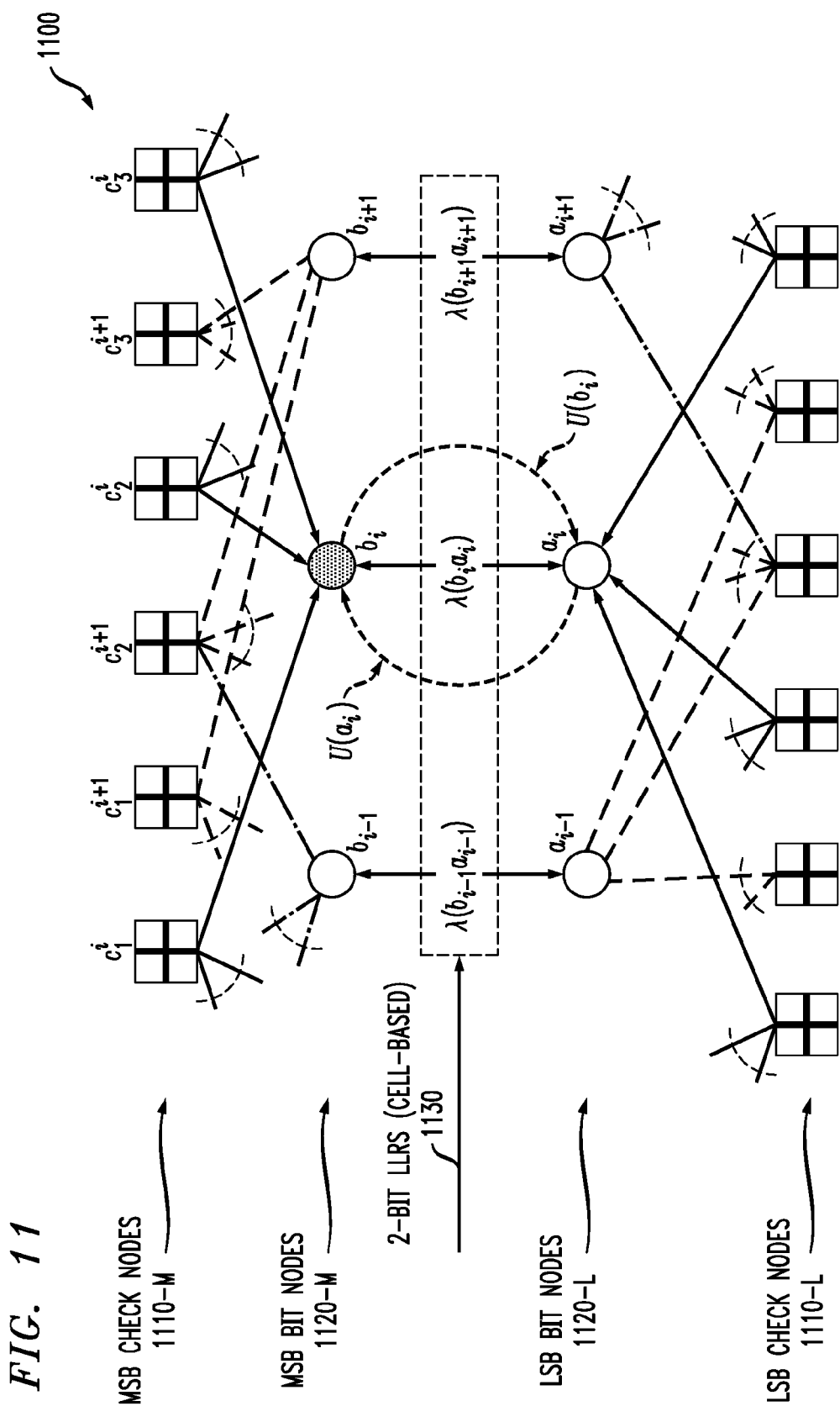
FIG. 11 illustrates an exemplary belief propagation decoding technique incorporating aspects of the invention.

FIG. 11 illustrates an exemplary belief propagation decoding technique 1100 incorporating aspects of the invention. As shown in FIG. 11, in a recovery mode, LSB and MSB check nodes 1110-L, 1110-M are processed separately and LSB and MSB bit nodes 1120-L, 1120-M are processed separately. Messages are exchanged from LSB check nodes 1110-L to LSB bit nodes 1120-L, and separately from MSB check nodes 1110-M to MSB bit nodes 1120-M. In addition, messages are exchanged between LSB and MSB bit nodes 1120-L, 1120-M.

In addition, joint 2-bit cell-based LLRs 1130 are applied to both LSB and MSB bit nodes 1120-L, 1120-M.

In addition, a quantity V for a given MSB bit node $b_i$ is a function of the messages U exchanged from the corresponding LSB bit node $a_i$ and any messages received by a given set of bits $b_i a_i$ from the channel, such as the cell-based 2-bit LLRs 1130 ($\lambda(b_i a_i)$) for each possible combination of the values of bits $b_i a_i$. V can be computed for a given bit $b_i$ as follows:

$$V(b_i) = \max{}^* [\lambda(b_i a_i = 00) + U(a_i), \lambda(b_i a_i = 01)] - \max{}^* [\lambda(b_i a_i = 10) + U(a_i), \lambda(b_i a_i = 11)] + U(b_i).$$

Figure 12:
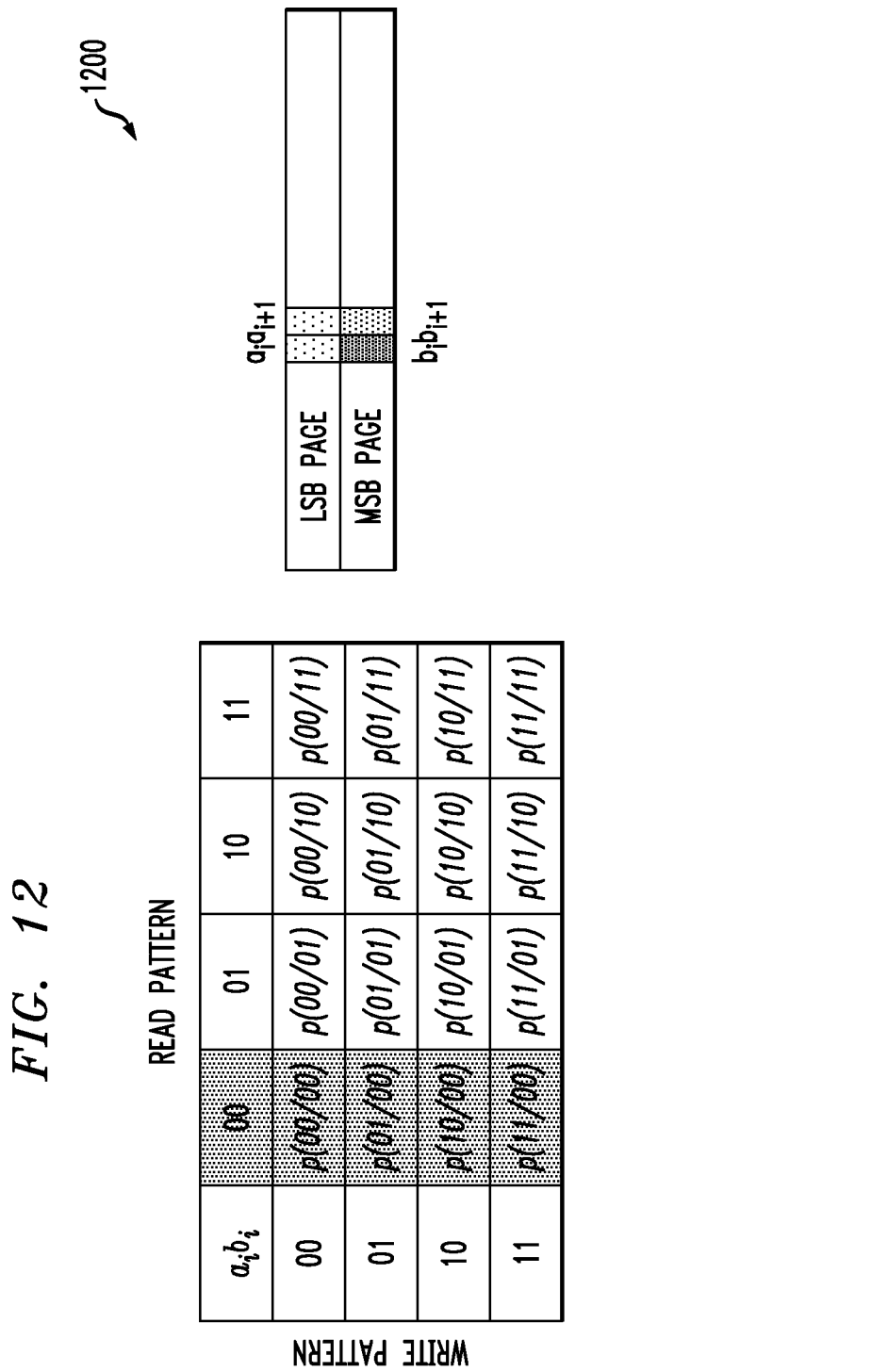
FIG. 12 illustrates an exemplary transition probability table that records collected intra-wordline statistics indicating a transition probability for a given cell value.

FIG. 12 illustrates an exemplary transition probability table 1200 that records collected intra-wordline statistics indicating a transition probability for a given cell value conditioned on neighboring bits in a wordline (e.g., adjacent bits in the same cell). The size of the transition probability table 1200 grows exponentially in the number of considered neighboring bits.

In the exemplary embodiment, the LLRs are calculated based on error statistics of the adjacent bits in the same cell. The error statistics can be collected using reference cells or past LDPC decisions of the pages in the wordline. For a discussion of suitable reference cell techniques, see, for example, U.S. patent application Ser. No. 13/063,899, filed Mar. 14, 2011, entitled "Methods and Apparatus for Soft Data Generation for Memory Devices Using Decoder Performance Feedback;" and/or U.S. patent application Ser. No. 13/063,895, filed Mar. 14, 2011, entitled "Methods and Apparatus for Soft Data Generation for Memory Devices Using Reference Cells," each incorporated by reference herein. The transition probability table 1200 records a probability that each possible pattern was written to cell i given that each possible pattern was read (i.e., the reliability of making a decision that a given pattern was written given that a given pattern was read in the normal mode 500). For example, the term "p(10/00)" indicates the probability that the pattern '10' was written to bits $a_i b_i$ in cell i given that pattern '00' was read for bits $a_i b_i$ (or the reliability of making a decision '10' given '00' was read in the normal mode).

The statistics in the transition probability table 1200 can be employed to compute joint LLRs as follows. Given that a particular pattern was read, such as a pattern of '00', the corresponding LLRs can be computed using distribution marginalization as follows:

$$\lambda(a_i b_i = 00|00) = \log[p(00/00)] - C, \lambda(a_i b_i = 01|00) = \log[p(01/00)] - C$$

$$\lambda(a_i b_i = 10|00) = \log[p(10/00)] - C, \lambda(a_i b_i = 11|00) = \log[p(11/00)] - C$$

where C is a normalization constant.

In a further variation, the transition probability table 1200 can be a function of one or more performance factors, including wordline index, as discussed above in conjunction with FIG. 9.

Non-Binary LLR Generation for Recovery Mode

As indicated above, FIG. 12 illustrates an exemplary transition probability table 1200 that records collected intra-wordline statistics indicating a transition probability for a given cell value. The size of the transition probability table 1200 grows exponentially in the number of pages in a wordline, or in one embodiment it grows exponentially in the total number of considered neighboring bits. The error statistics in the exemplary bit transition probability table 1200 are used to compute 2-bit joint GF(4) LLRs that correspond to the 4 possible states of a flash cell. For more information on bit transition probability tables, see U.S. patent application Ser. No. 13/731,766, filed Dec. 31, 2012, entitled "Detection and Decoding in Flash Memories Using Correlation of Neighboring Bits," incorporated by reference herein. An exemplary non-binary recovery mode detection and decoding process uses wordline (cell) access techniques, where the other pages in the wordline are read to generate the corresponding LLRs. In the exemplary embodiment, the LLRs are calculated based on data or error statistics of the adjacent bits in the same wordline, or based on data or error statistics of other aggressor wordlines that are being considered. The data or error statistics can be collected using reference cells or past LDPC decisions of the pages in the wordline. For a discussion of suitable error statistics collection techniques, see, for example, U.S. patent application Ser. No. 13/063,895, filed Mar. 14, 2011, entitled "Methods and Apparatus for Soft Data Generation for Memory Devices Using Reference Cells;" and/or U.S. patent application Ser. No. 13/063,899, filed Mar. 14, 2011, entitled "Methods and Apparatus for Soft Data Generation for Memory Devices Using Decoder Performance Feedback," each incorporated by reference herein.

The transition probability table 1200 records a transition probability for a given cell value conditioned on neighboring bits in a wordline (e.g., adjacent bits in the same cell). The size of the transition probability table 1200 grows exponentially in the number of considered neighboring bits. For example, the term "p(10/00)" indicates the probability that the pattern '10' was written to bits $a_i b_i$ given that pattern '00' was read (or the reliability of making a decision '10' given '00' was read in the normal mode). This table can also be used for bits in other cells, such as cell i+1 as would be apparent to a person of ordinary skill in the art. It is again noted that both pages in the wordline are read in a non-binary recovery mode.

The statistics in the transition probability table 1200 can be employed to compute LLRs as follows. Given that a particular pattern was read, such as a pattern of '00', the corresponding symbol LLRs can be computed as, where C is some normalization constant,)

$$\lambda(a_i b_i=00|00)=\log[p(00/00)]-C, \lambda(a_i b_i=01|00)=\log[p(01/00)]-C;$$

$$\lambda(a_i b_1=10|00)=\log[p(10/00)]-C, \lambda(a_i b_i=11|00)=\log[p(11/00)]-C$$

For a discussion of LLR generation conditioned on several designated neighboring bits, see. U.S. patent application Ser. No. 13/731,766, filed Dec. 31, 2012, entitled "Detection and Decoding in Flash Memories Using Correlation of Neighboring Bits," incorporated by reference herein.

In a further variation, the bit transition probability table 1200 can be a function of one or more performance factors, such as endurance, number of program/erase cycles, number of read cycles, retention time, temperature, temperature changes, process corner, ICI impact, location within the memory array 170, location of wordline and/or page from which the read values are obtained, location of page within wordline from which the read values are obtained and a pattern of aggressor cells. One or more of the performance factors can be varied for one or more different bits within a cell, different pages within a wordline, different bit lines or different hard read data values. For a more detailed discussion of suitable techniques for computing a log likelihood ratio for memory devices based on such performance factor adjustments, see, for example, International Patent Application Serial No. PCT/US09/59069, filed Sep. 30, 2009, entitled "Methods and Apparatus for Soft Data Generation for Memory Devices Based on Performance Factor Adjustment," incorporated by reference herein.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for processing data from a flash memory device, comprising:
obtaining one or more read values for a plurality of bits from one or more pages of said flash memory device;
converting said one or more read values for said plurality of bits to a non-binary log likelihood ratio based on a probability that a given data pattern was written to said plurality of bits when a particular pattern was read from said plurality of bits; and decoding said plurality of bits using a binary decoder.

2. The method of claim 1, wherein said binary decoder comprises one or more binary Low Parity Density Check Message Passing decoders.

3. The method of claim 1, wherein said non-binary log likelihood ratio captures one or more of intra-cell correlations and intra-page correlations.

4. The method of claim 1, wherein a least significant bit and a most significant bit of a given cell are independently converted to said non-binary log likelihood ratio.

5. The method of claim 4, wherein said decoding of said non-binary log likelihood ratio for said least significant bit and said non-binary log likelihood ratio for said most significant bit of said given cell are performed independently.

6. The method of claim 5, wherein said local iterations for said decoding of said least significant bit and said most significant bit of said given cell are performed independently.

7. The method of claim 4, wherein said decoding of said least significant hit and said decoding of said most significant hit are performed using independent message passing graphs.

8. The method of claim 4, wherein said non-binary log likelihood ratios for said least significant bit and said most significant bit are based on error statistics collected in a sliding window for a given page.

9. The method of claim 4, wherein said decoding further comprises the step of computing a sum V of the messages into a given bit node $b_i$ as a function of messages U exchanged among bit nodes and messages $\lambda(b_i b_{i+1})$ received by a given set of bits $b_i b_{i+1}$ for each possible combination of bits $b_i b_{i+1}$, as follows:

$$V(b_i) = \max{}^* [\lambda(b_i b_{i+1} = 00) + U(b_{i+1}), \lambda(b_i b_{i+1} = 01)] -$$
$$\max{}^* [\lambda(b_i b_{i+1} = 10) + U(b_{i+1}), \lambda(b_i b_{i+1} = 11)] + U(b_i).$$

where $\max{}^*(\psi, \zeta) = \max(\psi, \zeta) + \log(1 + e^{-|\psi-\zeta|})$.

10. The method of claim 4, wherein said decoding further comprises the step of computing a sum V of the messages into a given bit node $b_i$ as a function of messages U exchanged among bit nodes and messages $\lambda(b_i b_{i-1} b_{i+2})$ received by a given set of bits $b_i b_{i+1} b_{i+2}$ for each possible combination of bits $b_i b_{i+1} b_{i+2}$, as follows:

$$V(b_i) = \max{}^* \begin{bmatrix} \lambda(b_i b_{i+1} b_{i+2} = 000) + U(b_{i+1}) + U(b_{i+2}), \\ \lambda(b_i b_{i+1} b_{i+2} = 001) + U(b_{i+1}), \\ \lambda(b_i b_{i+1} b_{i+2} = 010) + U(b_{i+2}), \\ \lambda(b_i b_{i+1} b_{i+2} = 011) \end{bmatrix} -$$
$$\max{}^* \begin{bmatrix} \lambda(b_i b_{i+1} b_{i+2} = 100) + U(b_{i+1}) + U(b_{i+2}), \\ \lambda(b_i b_{i+1} b_{i+2} = 101) + U(b_{i+1}), \\ \lambda(b_i b_{i+1} b_{i+2} = 110) + U(b_{i+2}), \\ \lambda(b_i b_{i+1} b_{i+2} = 111) \end{bmatrix} + U(b_i).$$

where $\max{}^*(\psi, \zeta) = \max(\psi, \zeta) + \log(1 + e^{-|\psi-\zeta|})$.

11. The method of claim 1, wherein said non-binary log likelihood ratio comprises a cell-based Galois Field value that captures intra-cell correlations.

12. The method of claim 1, wherein a least significant bit and a most significant bit of a given cell are jointly converted to said non-binary log likelihood ratio.

13. The method of claim 12, wherein said decoding of said joint non-binary log likelihood ratio for said least significant bit and said most significant bit of said given cell are performed independently.

14. The method of claim 12, wherein said decoding of said joint non-binary log likelihood ratio for said least significant bit and said most significant bit of said given cell are performed independently with joint local iterations.

15. The method of claim 12, wherein said decoding of said least significant bit and said decoding of said most significant bit are performed using independent message passing graphs that communicate with one another.

16. The method of claim 12, wherein said decoding further comprises the step of computing a sum V of messages into a given bit node $b_i$ as a function of messages U exchanged from a corresponding least significant bit node $a_i$ and any messages $\lambda(b_i a_i)$ received by a given set of bits $b_i a_i$ in a cell for each possible combination of bits $b_i a_i$, follows:

$$V(b_i) = \max{}^* [\lambda(b_i a_i = 00) + U(a_i), \lambda(b_i a_i = 01)] -$$
$$\max{}^* [\lambda(b_i a_i = 10) + U(a_i), \lambda(b_i a_i = 11)] + U(b_i).$$

where $\max{}^*(\psi, \zeta) = \max(\psi, \zeta) + \log(1 + e^{-|\psi-\zeta|})$.

17. The method of claim 1, wherein said method comprises a recovery mode that is initiated if a normal operating mode does not successfully decode one or more of said plurality of bits for a given page.

18. The method of claim 1, wherein said probability that said given data pattern was written to said plurality of bits when said particular pattern was read from said plurality of bits is obtained from one or more tables.

19. The method of claim 1, wherein said given data pattern comprises one or more of a plurality of bits in a given page and a plurality of bits in a given cell.

20. The method of claim 1, wherein said probability that said given data pattern was written to said plurality of bits when said particular pattern was read from said plurality of bits is based on one or more of one or more reference cells, one or more prior decoded decisions and one or more performance factors of said flash memory device.

21. A tangible machine-readable recordable storage medium for processing data from a flash memory device, wherein one or more software programs when executed by one or more processing devices implement the steps of the method of claim 1.

22. A flash memory system, comprising:

a reliability unit for converting one or more read values for a plurality of bits from one or more pages of said flash memory system to a non-binary log likelihood ratio based on a probability that a given data pattern was written to said plurality of bits when a particular pattern was read from said plurality of bits; and a decoder for decoding said plurality of bits using a binary decoder.

* * * * *

UNITED STATES PATENT AND TRADEMARK OFFICE
CERTIFICATE OF CORRECTION

PATENT NO. : 9,082,480 B2  
APPLICATION NO. : 13/780203  
DATED : July 14, 2015  
INVENTOR(S) : Abdel Hakim S. Alhussien et al.

Page 1 of 1

It is certified that error appears in the above-identified patent and that said Letters Patent is hereby corrected as shown below:

Title page Item (72) Inventors: replace "Adbel" with --Abdel--

Signed and Sealed this  
Fifth Day of July, 2016

Michelle K. Lee  
*Director of the United States Patent and Trademark Office*